March 30, 1965 D. A. KLEINMAN 3,175,929

SOLAR ENERGY CONVERTING APPARATUS

Filed May 24, 1960

INVENTOR
D. A. KLEINMAN
BY H. W. Lockhart
ATTORNEY

United States Patent Office 3,175,929 Patented Mar. 30, 1965

3,175,929
SOLAR ENERGY CONVERTING APPARATUS

David A. Kleinman, Plainfield, N.J., assignor to Bell Telephone Laboratories, Incorporated, New York, N.Y., a corporation of New York Filed May 24, 1960, Ser. No. 31,354
9 Claims. (Cl. 136—89)

This invention relates to improvements in semi-conductor photovoltaic devices of the kind commonly termed solar cells.

A solar cell is a semiconductor device employed to convert incident solar radiation into electrical energy and comprises a semiconductor wafer, typically silicon, having one large area p-n junction proximate and substantially parallel to a major surface of the wafer. Solar radiation or light incident upon this major surface gives rise to electron-hole pairs in the neighborhood of the p-n junction which serves to separate and collect the holes and electrons. Electrical connections to the wafer on both sides of the junction conduct the resulting current for useful applications.

The device, then, supplies a current proportional to the incident radiation and is used typically as a power supply for communication apparatus in remote farming regions and in space vehicles. Devices of this type are well known in the art and described in United States Patent No. 2,780,765, issued February 5, 1957, to D. M. Chapin, C. S. Fuller, and G. L. Pearson.

One of the major continuing problems in relation to solar cells is to increase the power output without increasing the size of the devices.

Accordingly, one object of this invention is a solar cell having an improved efficiency.

This invention is based on the discovery that a second junction placed substantially parallel to, and at a particular distance from, the first junction will increase the efficiency of a solar cell. In particular, the second junction is positioned to collect charge carriers created too far from the first cell to be collected thereby before recombination.

In one embodiment, a semiconductor wafer has one region of a first conductivity type intermediate two regions of a second conductivity type. The three regions define two p-n junctions substantially parallel to a major surface of the wafer. The first of these junctions advantageously lies less than $1-3\times10^{-4}$ centimeters below the illuminated surface. The second junction lies a prescribed distance from the first junction which distance depends on the depth of the first junction and the minority carrier diffusion length characteristic of the particular material. Typically, this distance is between one and three such diffusion lengths. A separate low resistance contact is provided to each of the three regions, the contacts to the two regions of the same conductivity type being connected together.

In another embodiment, a semiconductor wafer has one region of one conductivity type intermediate two regions of the opposite conductivity type where the intermediate region is penetrated by tube-like portions of material of the opposite conductivity type. These tube-like portions provide an internal electrical connection between the two regions of the same conductivity type. The three regions define, except at the tube-like interconnections, two p-n junctions which are substantially parallel to the illuminated face of the semiconductor wafer. As in the earlier described embodiment, one p-n junction is approximately $1-3\times10^{-4}$ centimeters below the illuminated face, the second junction being a prescribed distance from the first junction which distance depends on the depth of the first junction and the minority carrier diffusion length for the particular material.

Measurements made by conventional methods indicate increased efficiencies for two junction solar cells over their single junction counterparts. Moreover, the improved efficiency makes feasible the use of semiconductors having more advantageous energy gaps than silicon, such as gallium arsenide which, ordinarily, would have much lower collection efficiencies.

The invention and the various objects and features thereof will be understood more clearly and fully from the following detailed description rendered in relation to the accompanying drawing in which.

It is to be understood that the figures are illustrative only and therefore are not necessarily to scale.

Figure 1:
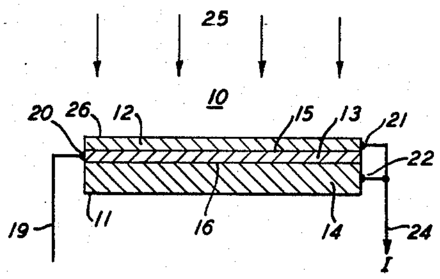
FIG. 1 is a cross-sectional view of one form of solar cell in accordance with this invention.

Considering FIG. 1 in detail, the device 10 comprises a monocrystalline silicon semiconductor wafer 11, typically 0.5 inch square by 0.02 inch deep, having three regions 12, 13 and 14 of p, n, and p-type conductivity, respectively, defining therebetween p-n junctions 15 and 16. Typically, junctions 15 and 16 are $10^{-4}$ centimeters and $3.2\times10^{-4}$ centimeters, respectively, from the surface 26 herein termed the illuminated surface. These dimensions are appropriate for a silicon wafer having a characteristic minority carrier diffusion length of about $10^{-2}$. Such a structure can be fabricated by well-known diffusion techniques. Conductor 19 is connected to the region 13 by ohmic contact 20. Regions 12 and 14 are electrically connected in parallel to conductor 24 through ohmic contacts 21 and 22, respectively.

Typically, region 14 is made relatively thick with respect to regions 12 and 13. In this manner, the device is rendered mechanically strong without a corresponding sacrifice of efficiency since it is not contemplated to expose to solar radiation both major surfaces of the cell. As a result, both junctions of the structure of FIG. 1 lie a distance from the illuminated surface less than the effective depth of penetration of the incident radiation. On the other hand, both junctions are insulated from any residual radiation incident upon the opposite surface of the solar cell. A typical thickness for region 14 is over .003 inch. The effective depth of penetration may be defined as the depth at which the average photon is absorbed.

In operation, electromagnetic radiation 25 is incident upon a surface 26 of semiconductor wafer 11. Electron-hole pairs are generated in the wafer and result in a flow of current I in conductors 19 and 24 when they are interconnected, as by way of a load.

As in prior art cells, the location of the first junction represents a compromise. The high surface recombination rate, characteristic of solar cells requires for maximum efficiency that this junction be as close to the surface as possible. On the other hand, to keep internal losses in the cell itself to a reasonably low level, it is important to avoid too thin a surface layer. A satisfactory compromise is to locate the first junction between one and three times $10^{-4}$ centimeters below the illuminated surface.

The location of the second junction is chosen to maximize the collection of charge carriers created too far from the first junction to be collected efficiently by such first junction. As a consequence, this second junction should not be positioned significantly less than a diffusion length from the first junction. However, it does little good to position the second junction much beyond the depth of effective penetration of the radiation and creation of hole electron pairs. This depth of effective penetration is a function of the semiconductor material. Based on the analysis developed in more detail below, it is found that the location of the second junction advantageously should be from slightly less than one to about three diffusion lengths from the illuminated surface of the cell, the particular optimum distance being related to the specific value of the diffusion length in the silicon material. Actually this analysis is applicable to other semiconductor materials and gives analogous results.

An appropriate expression for the collection efficiency of a solar cell is obtained by solving an equation describing the production, diffusion and recombination of minority carriers subject to the conditions that the minority carrier density vanishes at each junction, at the surface of the device and at infinity. The solution of this equation is substituted into an expression for the short circuit current $I_g$ which is the total diffusion current at all junctions. The collection efficiency Q is obtained, as a factor of the expression for $I_g$, in terms of the desired parameters.

A theoretical expression for the efficiency of a one junction solar cell is given by W. G. Pfann and W. W. Roosbroeck in the Journal of Applied Physics 25, 1422 (1954). The expression is obtained on the basis of an equivalent circuit for the solar cell. According to this equivalent circuit the solar cell may be regarded as a generator of current $I_g$ which is in parallel with a p-n junction of such polarity that some of the current $I_g$ flows through the junction in the forward direction while the remainder flows through the load. It is well known that the collection efficiency of a solar cell can be calculated if $I_g$ is known and the current-voltage characteristic of the junction is known.

Analytically then, the generator current can be written conveniently as $$I_g=eNA\cdot Q \qquad (1)$$

where Q is the collection efficiency, $e$ is the charge on an electron, A is the area and N is the flux of photons capable of producing hole electron pairs. It is to be noted that the current $I_g$ is identical with the short circuit current of the solar battery.

It is necessary now to consider the distribution of minority carriers in space in a solar cell and the mathematical theory of the collection of minority carriers. If the concentration of minority carriers is small compared to the concentration of majority carriers, the equation describing the production, diffusion, and recombination of minority carriers is $$D\frac{d^2n}{dx^2}-\frac{n}{\tau}+\int_0^{\lambda G} N(\lambda)\alpha(\lambda)e^{-\alpha x}d\lambda=0 \qquad (2)$$

In (2) $n(x)$ is the excess minority carrier concentration over the equilibrium concentration. Since in a typical case the maximum value of $n$ is of order $10^{12}$ cm.$^{-3}$ the validity of (2) is assured, even for a considerable concentration of sunlight.

The collection problem in the solar cell is to calculate the short circuit current which is the total diffusion current at all junctions $$I_E=\Sigma_a eDA\left\{\left|\frac{dn}{dx}\right|_{a-}+\left|\frac{dn}{dx}\right|_{a+}\right\} \qquad (3)$$

taking into account the contributions from each side of each junction. In this equation there will be one term for each junction. For simplicity the same diffusion constant D for both holes and electrons as well as the same lifetime $\tau$ shall be used. In (3) $n(x)$ is the solution of (2) satisfying the boundary conditions noted above.

A particular solution of Equation 2 which does not satisfy all the boundary conditions is $$n(x)_D=\int_0^{\lambda G} N(\lambda)\tau\frac{\alpha(\lambda)}{1-\alpha^2L^{-2}}\{e^{-\alpha x}-e^{-x/L}\}d\lambda \qquad (4)$$

Physically this represents the excess minority carrier concentration that solar radiation would produce in a homogeneous semiconductor with no junction.

It is now convenient to adopt L, the minority carrier diffusion length, as a unit of length, and introduce the notation $$s=x/L \qquad (5)$$

$$\beta=\alpha L \qquad (6)$$

$$\xi=a/L \qquad (7)$$

and define the function $$\varphi[z]=\frac{e^z-1}{z} \qquad (8)$$

Then (4) can be written $$n(x)_D=\frac{N\tau}{L}F(s) \qquad (9)$$

where $F(s)$ is an integral over the solar spectrum $$F(s)=se^{-s}\int_0^{\lambda G}\nu(\lambda)\frac{\beta}{1+\beta}\varphi[s(1-\beta)]d\lambda \qquad (10)$$

Actually $F(s)$ is a function not only of $s$ but also of L. FIG. 2 is a plot of $F(s)$ versus distance in diffusion lengths from the incident surface for the three diffusion lengths $10^{-4}$, $10^{-3}$, $10^{-2}$ centimeters based on the absorption curve of silicon and the solar spectrum discussed in the publication "Physical Review" 99, 1151 (1955), by W. Dash and R. Newman; and "Smithsonian Physical Tables," edited by W. E. Forsythe (Smithsonian Institution, Washington, 1954), respectively. A separate $F(s)$ is computed for each semiconductor material from the measured absorption coefficient.

Having obtained $F(s)$, the solution $n(x)$ of (2) between any two junctions may be written $$n(x)=\frac{N\tau}{L}\{Ae^{s}+Be^{-s}+F(s)\} \qquad (11)$$

Adjusting A and B to satisfy the boundary conditions gives for the one junction solution $$0\leq x\leq a \quad n(x)\frac{N\tau}{L}\left\{F(s)-\frac{\sinh s}{\sinh \xi}F(\xi)\right\} \qquad (12)$$

$$a\leq x<\infty \quad n(x)=\frac{N\tau}{L}\{F(s)-e^{\xi-s}F(\xi)\} \qquad (13)$$

The current (3) is easily found to be $$I_g=eNA\cdot F(\xi)\{1+\coth \xi\} \qquad (14)$$

It is not necessary to know $dF/ds$ for this problem. A knowledge of $F(s)$ provides a complete solution to the collection problem. The method has the advantage that the solar spectrum is integrated once and for all, after which any solution of (2) can be constructed.

The collection efficiency Q introduced in (1) is the factor multiplying $e$NA in (14). Denoting by $Q_1$ the collection efficiency of a solar cell with a single junction at $x=a$ or $s=\xi$, $$Q_1=F(\xi)\{1+\coth \xi\} \qquad (15)$$

the collection efficiency is improved by placing a second junction at $x=b$ or $s=\eta=b/L$. Some of the carriers too far from the first junction are collected at the second junction. The solution $n(x)$ for this case in the region $0\leqq x\leqq a$ is still given by (12); the remainder of the solution is $$a\leq x\leq b \quad n(x)=\frac{N\tau}{L}\left\{F(s)-\frac{\sinh(\eta-s)}{\sinh(\eta-\xi)}F(\xi)\right\} \qquad (16)$$

$$b\leq x\leq\infty \quad n(x)=\frac{N\tau}{L}\{F(s)-e^{\eta-s}F(\eta)\} \qquad (17)$$

The total collection efficiency is now $$Q_2=F(\xi)[\coth \xi+\tanh \tfrac{1}{2}(\eta-\xi)] +F(\eta)[1+\tanh \tfrac{1}{2}(\eta-\xi)] \quad (18)$$

The superiority of the two junction device over the single junction device (having the first junction at the same depth) may be measured by the quantity $$\delta=(Q_2-Q_1)/Q_1$$

$$\delta=\frac{F(\eta)}{F(\xi)}\frac{1+\tanh \frac{1}{2}(\eta-\xi)}{1+\coth \xi}-\frac{1-\tanh \frac{1}{2}(\eta-\xi)}{1+\coth \xi} \quad (19)$$

which is the fractional improvement in terms of the one junction efficiency. In order to determine the optimum location of the second junction $a$ and L are specified. A typical value for $a$, the depth of the first junction, is $a=10^{-4}$ centimeters; on this basis $\delta(\eta)$ for three values of L, the minority carrier diffusion length, have been plotted in FIG. 3. It is noted that $\delta(\eta)$ has a well-defined maximum which determines the optimum location for the second junction. In Table I are listed for the three values of L the single junction collection efficiency $Q_1$ in the second column and the maximum value of $\delta(\eta)$ in the third column, all based on $a=10^{-4}$ centimeters and $F(s)$ for silicon.

*Table I*

| L(cm.) | $Q_1$ | $\delta$ max. | $\delta'$ |
|---|---|---|---|
| $10^{-4}$ | .186 | .443 | .417 |
| $10^{-3}$ | .420 | .258 | .226 |
| $10^{-2}$ | .634 | .092 | .055 |

Figure 3:
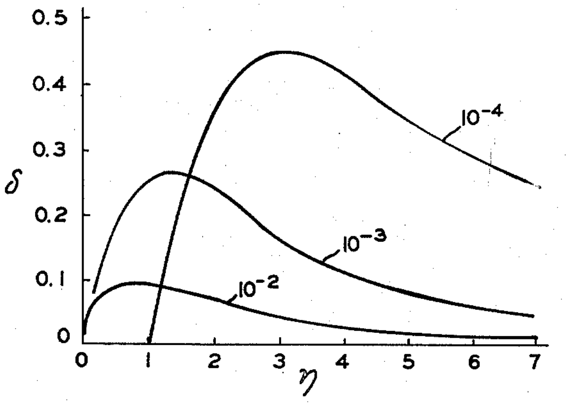
FIG. 3 is a graph of the relative collection efficiency versus depth of a second p-n junction below the illuminated surface for a solar cell for the case where the first junction is positioned for efficient collection.

From the table and from FIG. 3 it is evident that very considerable improvement is obtained from the second junction if the diffusion length is short $L\sim10^{-4}$ centimeters. The improvement is less for long diffusion lengths $L\sim10^{-2}$ centimeters. Looking at the $Q_1$ column we see that it is the very poor cells, poor because of a short diffusion length, that benefit the most from a second junction.

Now the improvement in the over-all efficiency $\epsilon$ can be considered. For large illumination, such as solar radiation, the reduced current G will ordinarily be very large, of the order $10^7$. In this range, from the Pfann and Van Roosbroeck reference noted above $$\epsilon \approx \frac{kT}{W} Q \ln G \quad (20)$$

where $K$=Boltzmann's constant, $T$=degrees Kelvin, $$G=\frac{I_g}{I_o}$$

$I_0$ is the characteristic current of the junction, and W is the energy absorbed to produce one hole electron pair as defined in the reference.

The efficiency of the two junction device can be written $$\epsilon_2\approx\frac{kT}{W}Q_2\ln\left[G\cdot\frac{Q_2}{2Q_1}\right] \quad (21)$$

where the replacement of G with ½G takes into account the doubling of the junction area. An over-all efficiency improvement parameter is defined as $$\delta'=(\epsilon_2-\epsilon_1)/\epsilon_1 \quad (22)$$

From (20) and (21) and the relation $Q_2/Q_1=1+\delta$ $$\delta'=\delta+(1+\delta)\cdot\frac{\ln \frac{1}{2}(1+\delta)}{\ln G} \quad (23)$$

The last column in Table I gives values of $\delta'$ obtained by placing $\ln G=18$ in (23). For the cases shown $\delta'$ is only a little smaller than $\delta$, so that the second junction improves the over-all efficiency.

In brief, then, $b$, the distance between the surface of the semiconductor wafer and the second junction is selected to give the maximum improvement in collection efficiency. This selection defines the function $$\eta=\frac{b}{L}=\eta(\xi, L)$$

where $$\xi=\frac{a}{L}$$

is the distance between the surface of the semiconductor wafer and the first junction in terms of the minority carrier diffusion length, L. For all practical purposes, Table I shows that $\delta'$ is almost equal to $\delta$ for large improvements. Therefore, $\delta$ max. may be considered to define $\eta$. Illustrative calculations yield for silicon $b=3.2\times10^{-4}$ centimeters, $1.3\times10^{-3}$ centimeters and $.8\times10^{-2}$ centimeters for $a=10^{-4}$ centimeters and $L=10^{-4}$, $10^{-3}$, $10^{-2}$ centimeters, respectively. Suitable materials other than silicon such as the group III–V intermetallic compound semiconductors exemplified by gallium arsenide probably have lower collection efficiencies than silicon indicating a greater improvement by this invention.

Other embodiments of this invention are possible. For example, certain advantages such as reduction in resistance losses are gained by providing internal electrical connections between the region of like conductivity. This feature is included in the embodiment of the invention shown in FIG. 4A and FIG. 4B. The device comprises a crystal of semiconductor material typically 0.5 inch square by 0.02 inch thick. The crystal is divided into the three zones 33, 34 and 35 which are illustratively p, n and $p^+$, respectively. These zones are substantially parallel to the face 36 which is the illuminated surface. p-n junctions 31 and 32 are defined by the interface between conductivity zones 33 and 34 and 34 and 35, respectively. Small tube-like portions 38 shown in FIG. 4A and FIG. 4B constitute a plurality of internal electrical connections between regions 33 and 35. Ohmic contacts 39 and 40 are connected to the p- and n-type conductivity regions, respectively. As is FIG. 1, region 33 is relatively thick with respect to regions 34 and 35.

Figure 4A:
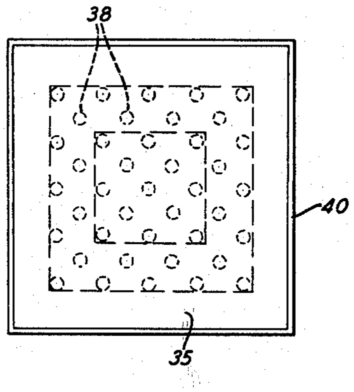
FIG. 4A is a top view of another form of solar cell in accordance with this invention.
Figures 2, 4B:
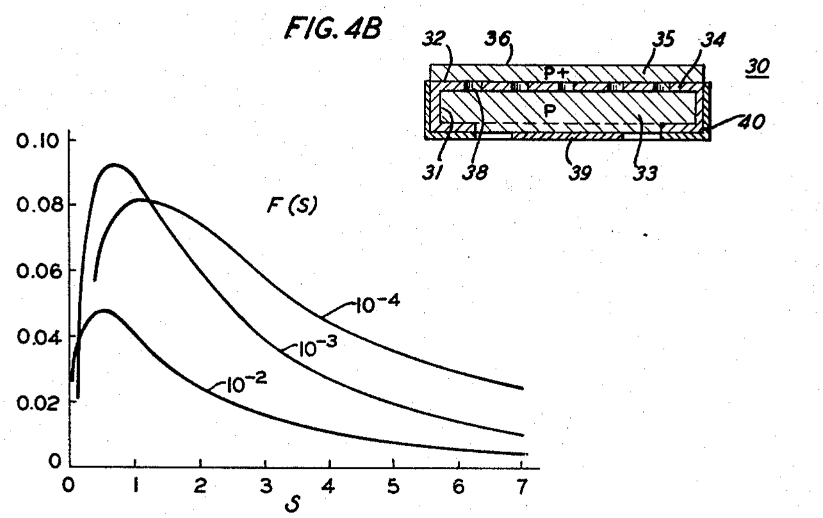
FIG. 2 is a graph of the excess minority carried concentration produced by solar radiation plotted against distance below the illuminated surface in a homogeneous semiconductor of one conductivity type.
FIG. 4B is a cross-sectional view of the solar cell of FIG. 4A.

A device as shown in FIG. 4A is fabricated by lapping and etching in accordance with well-known techniques, a 0.5 by 0.5 by 0.02 inch slice of p-type silicon crystal having a resistivity of 0.1 ohm-centimeter. The slice then is heated at 110 degrees centigrade in wet oxygen gas for 8 hours to encrust the slice in a 6000 angstrom thick coating of silicon oxide. Subsequently, a solution of trichloroethylene and black Apiezon wax W is sprayed through a metallic mask containing an array of holes onto areas of a major surface of the device. Then the remaining surfaces of the device are coated with the wax except for a portion of the opposed major surface of the device. The slice is etched for about three minutes in a concentrated solution of hydrofluoric acid to remove the oxide coating from the unwaxed areas and washed in trichloroethylene to remove the wax. The device subsequently is heated to 1250 degrees centigrade in an atmosphere of red phosphorus vapor for four hours to provide an n-type layer at the major surface .0006 inch deep having a surface concentration of $10^{19}$ atoms per cubic centimeter and a sheet resistance of about 3 ohms per square centimeter. The major surface then is rinsed in hydrofluoric acid to remove the oxide. Next a heating step at 1200 degrees centigrade for ten minutes in an atmosphere of $B_2O_3$ vapor produces a $p^+$-type layer at the major surface 0.00007 inch with a surface concentration of about $5\times10^{20}$ atoms per cubic centimeter and a sheet resistance of 4 ohms per square centimeter. This step is followed by rinsing in hydrofluoric acid to remove the residual oxide and contacting the n-type region with a gold-antimony alloy. The p-type region is contacted with aluminum by alloying at 600 degrees centigrade for one minute.

No effort has been made to describe all possible embodiments of the invention. It should be understood that the embodiments described are merely illustrative of the preferred form of the invention and various modifications may be made therein without departing from the spirit and scope of this invention.

It should be evident that the specific embodiments described are merely illustrative of the principles of the invention. These principles are applicable to solar cells generally, independent of the particular semiconductor material. As such the invention has particular application to solar cells of gallium arsenide and indium phosphide.

Moreover, the principles of the invention may be extended to the introduction of still additional junctions in the cell where the effective penetration of the radiation warrants.

What is claimed is:

1. A semiconductor element for converting solar radiation into electrical energy comprising a semiconductor body having two major opposed surfaces and including therein two regions of a first conductivity type with an interposed region of an opposite conductivity type, said regions defining a first and a second p-n junction therebetween, which junctions are substantially coextensive and parallel, said first junction being in energy converting relation to one of said major opposed surfaces, said second junction being a distance $$\frac{b}{L}$$

from said one surface determined by the functional relation $$\eta=\frac{b}{L}=\eta(\xi, L)$$

where $$\xi=\frac{a}{L}$$

is the depth of said first p-n junction in diffusion lengths and L is the minority carrier diffusion length, said second junction being in energy converting relation to said one major surface and to said first junction, said second junction location being defined when the expression $$\frac{F(\eta)}{F(\xi)}\,\frac{1+\tanh \frac{1}{2}(\eta-\xi)}{1+\coth \xi}-\frac{1-\tanh \frac{1}{2}(\eta-\xi)}{1+\coth \xi}$$

is a maximum, and an ohmic contact attached to each of said conductivity type regions, the two ohmic contacts to the regions of first conductivity type being connected.

2. A structure in accordance with claim 1 wherein said semiconductor body is silicon.

3. A structure in accordance with claim 1 wherein said semi-conductor body is composed of a group III–V intermetallic compound semiconductor material.

4. A structure in accordance with claim 1 wherein said semiconductor body is composed of gallium arsenide.

5. A structure in accordance with claim 1 wherein said semiconductor body is composed of indium phosphide.

6. A semiconductor element in accordance with claim 1 wherein said ohmic contacts are connected to one of the two regions of the first conductivity type and to the region of opposite conductivity type and wherein the two regions of the first conductivity type are electrically connected internally.

7. A semiconductor device for converting solar radiation into electrical energy comprising a semiconductor body having two major opposed surfaces and including therein a first and second region of a first conductivity type with an interposed region of an opposite conductivity type, said regions defining a first and second p-n junction therebetween, which junctions are substantially coextensive and parallel, said intermediate region being penetrated by tube-like interconnections of said first conductivity type, said first junction being in energy converting relation to one of said major opposed surfaces, said second junction being a distance $$\frac{b}{L}$$

from said one surface defined by the functional relation $$\eta=\frac{b}{L}=\eta(\xi, L)$$

where $$\xi=\frac{a}{L}$$

is the depth of said first p-n junction in diffusion lengths and L is the minority carrier diffusion length, said second junction being in energy converting relation to said one major surface and to said first junction, said second junction location being defined when the expression $$\frac{F(\eta)}{F(\xi)}\,\frac{1+\tanh \frac{1}{2}(\eta-\xi)}{1+\coth \xi}-\frac{1-\tanh \frac{1}{2}(\eta-\xi)}{1+\coth \xi}$$

is a maximum, and an ohmic contact to each of said second and said interposed conductivity regions.

8. A semiconductor device for converting solar radiation into electrical energy comprising a silicon body having two major opposed surfaces, said body being characterized by a minority carrier diffusion length of $10^{-4}$ centimeters, a p-n junction $10^{-4}$ centimeters distant from and substantially parallel to a first of the two major opposed surfaces, a second p-n junction $3.2\times10^{-4}$ centimeters distant from and substantially parallel to said first surface, said two junctions dividing said body into a first, second and third conductivity region and an ohmic contact to each of said first, second and third conductivity regions, said first and third regions being electrically connected in parallel.

9. A cell for converting incident solar radiation into electrical energy comprising a semiconductor wafer having a first and second substantially planar surface including a first layer contiguous to said first surface, a second layer contiguous to said first layer for forming a first p-n junction and a third layer contiguous with said second layer for forming a second p-n junction, the first and second junction each being parallel to said first surface, said first junction being spaced from said first surface a distance no greater than two diffusion lengths, said second junction being spaced from said first surface a distance greater than that of said first junction but less than the effective depth of penetration of solar radiation incident upon said first surface, and second junction being spaced from said second surface a distance greater than the effective depth of penetration of solar radiation incident upon said second surface, one output terminal electrically connected to the first and third layers, and a second output terminal electrically connected to the second layer.

References Cited in the file of this patent

UNITED STATES PATENTS

| | | |
|---|---|---|
| 2,406,139 | Fink et al. | Aug. 2, 1946 |
| 2,780,765 | Chapin et al. | Feb. 5, 1957 |
| 2,794,846 | Fuller | June 4, 1957 |
| 2,919,299 | Paradise | Dec. 29, 1959 |
| 2,949,498 | Jackson | Aug. 16, 1960 |
| 2,953,621 | Schultz | Sept. 20, 1960 |

JOHN H. MACK, *Primary Examiner.*

JOHN R. SPECK, *Examiner.*